US012598959B2

(12) United States Patent
Igarashi

(10) Patent No.: US 12,598,959 B2
(45) Date of Patent: Apr. 7, 2026

(54) TEMPERATURE CONTROLLING METHOD AND SUBSTRATE PROCESSING APPARATUS

(71) Applicant: Tokyo Electron Limited, Tokyo (JP)

(72) Inventor: Dai Igarashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 410 days.

(21) Appl. No.: 18/228,003

(22) Filed: Jul. 31, 2023

(65) Prior Publication Data

US 2023/0378004 A1 Nov. 23, 2023

Related U.S. Application Data

(63) Continuation of application No. PCT/JP2022/001940, filed on Jan. 20, 2022.

(30) Foreign Application Priority Data

Feb. 1, 2021 (JP) ................................. 2021-014182

(51) Int. Cl.
  *H01L 21/66* (2006.01)
  *H01J 37/32* (2006.01)
  *H01L 21/67* (2006.01)
(52) U.S. Cl.
  CPC ........ *H01L 22/20* (2013.01); *H01J 37/32522* (2013.01); *H01L 21/67248* (2013.01); *H01J 2237/24585* (2013.01)

(58) Field of Classification Search
  CPC ............... H01L 22/20; H01L 21/67248; H01L 21/67109; H01L 21/3065; H01L 21/67017; H01J 37/32522
  See application file for complete search history.

(56) References Cited

U.S. PATENT DOCUMENTS

| | | | | |
|---|---|---|---|---|
| 8,303,716 B2 * | 11/2012 | Wallace | ............ | H01L 21/68742 |
| | | | | 118/724 |
| 2008/0203925 A1 * | 8/2008 | Tandou | ............. | H01L 21/67109 |
| | | | | 315/111.21 |
| 2017/0278730 A1 * | 9/2017 | Tandou | ............. | H01J 37/32715 |
| 2019/0198299 A1 * | 6/2019 | Watanabe | ......... | H01L 21/67115 |

FOREIGN PATENT DOCUMENTS

JP 2010-516059 A 5/2010

* cited by examiner

*Primary Examiner* — Mong-Shune Chung
(74) *Attorney, Agent, or Firm* — XSENSUS LLP

(57) ABSTRACT

A system acquires a temperature TB of a temperature-controlling medium before a temperature change during execution of a plurality of processes n (n is identifier of process and is natural number that is greater than one) in each of which heat is input to a substrate placed on a placement surface of a stage, wherein the placement surface on which the substrate is placed is formed on the stage, a flow path through which the temperature-controlling medium having an adjusted temperature flows is formed in the stage, and a discharge port via which heat transfer gas is discharged toward the placement surface is formed in the stage; and for each of the processes n, a pressure $P_n$ of heat transfer gas supplied to the discharge port and a temperature $TW_n$ of the substrate. The system also adjusts a pressure of heat transfer gas so as to control temperature of substrate.

9 Claims, 10 Drawing Sheets

TRANSCRIPTION ◀╌╌

ABNORMAL ELECTRIC DISCHARGE ➡

INPUT HEAT FROM PLASMA

ΓQ: LARGE

ΓQ: MIDDLE

ΓQ: SMALL

TEMPERATURE CONTROLLING METHOD AND SUBSTRATE PROCESSING APPARATUS

CROSS-REFERENCE TO RELATED APPLICATIONS

This application is a continuation of International Application No. PCT/JP2022/001940, filed on Jan. 20, 2022 which claims the benefit of priority of the prior Japanese Patent Application No. 2021-014182, filed on Feb. 1, 2021, the entire contents of each are incorporated herein by reference.

FIELD

Exemplary embodiment disclosed herein relates to a temperature controlling method and a substrate processing apparatus.

BACKGROUND

A substrate processing apparatus executes a plurality of processes on a substrate that is arranged in a processing container in some cases. For example, in Japanese Laid-open Patent Publication No. 2010-516059, a process for generating plasma of a first process gas and a process for generating plasma of a second process gas are alternately executed on a substrate in a processing container.

The present disclosure provides a technology for correcting a change in the temperature of a substrate for each process in a case where a plurality of processes is executed on the substrate.

SUMMARY

According to an aspect of a present disclosure, A temperature controlling method includes:

acquiring:

a temperature TB of a temperature-controlling medium before a temperature change during execution of a plurality of processes n (n is identifier of process and is natural number that is greater than one) in each of which heat is input to a substrate placed on a placement surface of a stage, wherein the placement surface on which the substrate is placed is formed on the stage, a flow path through which the temperature-controlling medium having an adjusted temperature flows is formed in the stage, and a discharge port via which heat transfer gas is discharged toward the placement surface is formed in the stage; and for each of the processes n, a pressure $P_n$ of heat transfer gas supplied to the discharge port and a temperature $TW_n$ of the substrate;

acquiring:

for each of the processes n after the temperature change while using a temperature of the temperature-controlling medium as the temperature TB, a temperature $TW'_{n,max}$ of the substrate in the corresponding process n in a case where a pressure of the heat transfer gas supplied to the discharge port is reduced to be lower than the pressure $P_n$; and a temperature $TW'_{n,min}$ in of the substrate in the corresponding process n in a case where a pressure of the heat transfer gas supplied to the discharge port is increased to be greater than the pressure $P_n$;

adjusting a temperature of the temperature-controlling medium to a temperature TB" that satisfies a following formula (1); and for each of the processes n, adjusting a pressure of the heat transfer gas supplied to the discharge port such that a temperature of the substrate is the temperature $TW_n$.

$$TB+\max(TW_n-TW'_{n,max}) \leq TB'' \leq TB+\min(TW_n-TW'_{n,min}) \qquad (1)$$

DESCRIPTION OF EMBODIMENTS

Exemplary embodiments of a temperature controlling method and a substrate processing apparatus disclosed in the present application will be explained below in detail with reference to the accompanying drawings. The disclosed temperature controlling method and the substrate processing apparatus are not limited to the present embodiments.

Incidentally, in a case where substrate processing is repeatedly executed, a part in a substrate processing apparatus wears, thereby leading to a gradual time-dependent change in a temperature of a substrate. For example, a placement surface of a placing pedestal wears, on which a substrate is placed, and thus heat transfer characteristics change so that the temperature of the substrate time-dependently changes. In a case where a temperature of a substrate changes as described above, a process result of each process is affected in some cases. Thus, it may be considered to correct a temperature of a temperature-controlling medium, such as a chiller flowing through a placing pedestal; however, change characteristics of the temperature in a substrate differs for each process, so that it is impossible to correct change in the temperature of the substrate for each of the processes by correction of the temperature of the temperature-controlling medium alone.

Thus, there is desired a technology for correcting a change in the temperature of a substrate for each process in a case where a plurality of processes is executed on the substrate.

Embodiment

Configuration of Apparatus

Figure 1:
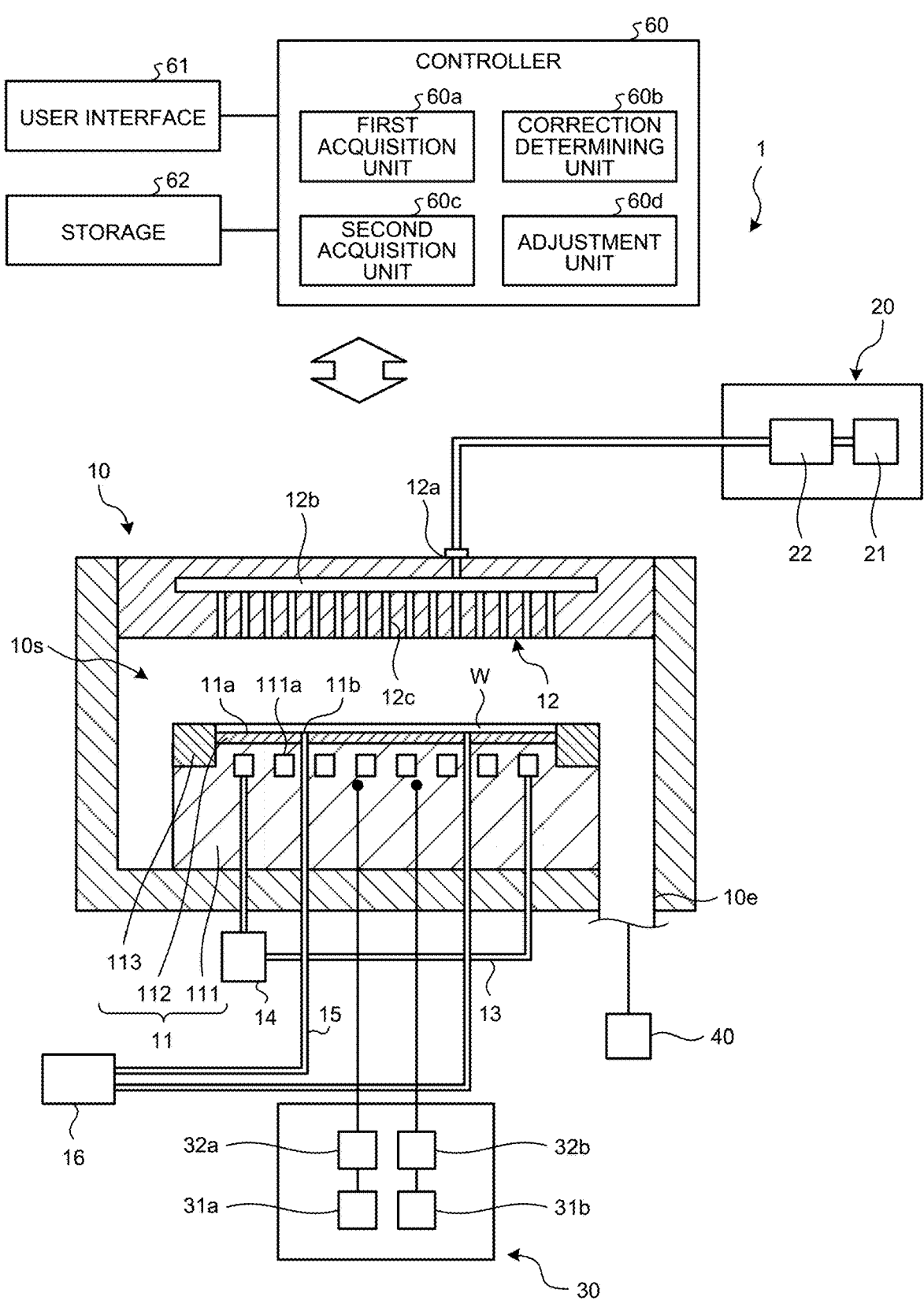
FIG. 1 is a schematic cross-sectional view illustrating one example of a substrate processing apparatus according to an embodiment.

One example of a substrate processing apparatus according to the present disclosure will be explained. First, a substrate processing apparatus 1 according to an embodiment will be explained. The substrate processing apparatus 1 performs substrate processing on a substrate W. In the embodiment, a case will be exemplified in which the substrate processing apparatus 1 is a plasma processing apparatus and further a plasma process is executed on the substrate W as substrate processing. FIG. 1 is a schematic cross-sectional view illustrating one example of the substrate processing apparatus 1 according to the embodiment. In one embodiment, the substrate processing apparatus 1 includes a chamber 10, a process gas supplying unit 20, a Radio Frequency (RF) electric power supplying unit 30, and an exhaust system 40. The substrate processing apparatus 1 further includes a placing pedestal 11 and an upper electrode showerhead 12.

A cylindrical space is formed in an inner part of the chamber 10. The placing pedestal 11 is arranged in the inner part of the chamber 10. The placing pedestal 11 is formed in columnar-shaped, and further is arranged in a lower portion region of the center in the chamber 10. The upper electrode showerhead 12 is arranged above the placing pedestal 11 so as to function as a part of a ceiling of the chamber 10.

A placement surface 11a, on which the substrate W such as a semiconductor wafer is placed, is formed in the center of an upper surface of the placing pedestal 11. The placing pedestal 11 is configured to support the substrate W in a plasma processing space 10s in which a plasma process is performed. In one embodiment, the placing pedestal 11 includes a lower electrode 111, an electrostatic chuck 112, and an edge ring 113. The electrostatic chuck 112 is arranged on the lower electrode 111, and is configured to support the substrate W with the use of an upper surface of the electrostatic chuck 112. The edge ring 113 is arranged so as to surround the substrate W in an upper surface of a periphery portion of the lower electrode 111. The lower electrode 111 is formed of an electric conductive material such as aluminum. The lower electrode 111 functions as a base that supports the electrostatic chuck 112 and the edge ring 113. The placing pedestal 11 may include a temperature controlling module that is configured to adjust a temperature of at least one of the electrostatic chuck 112 and the substrate W to a target temperature. The temperature controlling module may include a heater, a flow path, or a combination thereof. For example, a flow path 111a for causing a temperature-controlling medium to flow therein is formed in the lower electrode 111. The flow path 111a is formed in the all-over placement surface 11a in correspondence with the placement surface 11a on which the substrate W is placed. A temperature-controlling medium, such as refrigerant and heating medium, flows through the flow path 111a. For example, the flow path 111a is connected to a temperature-controlling medium supply unit 14 via a pipe 13. The temperature-controlling medium supply unit 14 is configured to control a temperature of the supplied temperature-controlling medium. The substrate processing apparatus 1 is configured to circulate a temperature-controlling medium (for example, cooling water) whose temperature is controlled from the temperature-controlling medium supply unit 14 to the flow path 111a to be capable of controlling the temperature of the placing pedestal 11.

The substrate processing apparatus 1 is configured to be capable of supplying heat transfer gas to a back-surface side of the substrate W. For example, a discharge port lib that discharges heat transfer gas is formed on the placement surface 11a of the placing pedestal 11. A gas supplying pipe 15 that penetrates through the placing pedestal 11 is connected to the discharge port lib. The gas supplying pipe 15 is connected to a heat transfer gas supplying unit 16. The heat transfer gas supplying unit 16 supplies heat transfer gas (backside gas) such as helium gas. The heat transfer gas supplying unit 16 is provided with a flow-volume controller to be capable of controlling a supply amount of the heat transfer gas. In accordance with the above-mentioned configurations, a temperature of an upper surface of the placing pedestal 11 is controlled to be capable of controlling the substrate W that is adsorbed and held by the electrostatic chuck 112.

The substrate processing apparatus 1 is configured to control a temperature of a temperature-controlling medium flowing into the flow path 111a and a flow volume of heat transfer gas to be supplied to a back-surface side of the substrate W to be capable of controlling a temperature of the substrate W.

The upper electrode showerhead 12 is configured to supply at least one process gas delivered from the process gas supplying unit 20 to the plasma processing space 10s. In one embodiment, the upper electrode showerhead 12 includes a gas intake port 12a, a gas diffusion chamber 12b, and a plurality of discharge ports 12c. The gas intake port 12a is fluidically communicated with the process gas supplying unit 20 and the gas diffusion chamber 12b. The plurality of gas discharge ports 12c is fluidically communicated with the gas diffusion chamber 12b and the plasma processing space 10s. In one embodiment, the upper electrode showerhead 12 is configured to supply at least one process gas from the gas intake port 12a to the plasma processing space 10s via the gas diffusion chamber 12b and the plurality of gas discharge ports 12c.

The process gas supplying unit 20 may include at least one gas source 21 and at least one flow-volume controller 22. In one embodiment, the process gas supplying unit 20 is configured to supply at least one process gas from the corresponding gas source 21 to the gas intake port 12a via the corresponding flow-volume controller 22. Each of the flow-volume controllers 22 may include a mass flow controller or a flow-volume controller having a pressure controlling type, for example. Furthermore, the process gas supplying unit 20 may include at least one flow volume modulating apparatus that modulates or pulses a flow volume of at least one process gas.

The RF electric power supplying unit 30 is configured to supply RF electric power, such as at least one RF signal, to at least one electrode such as the lower electrode 111, the upper electrode showerhead 12, or both of the lower electrode 111 and the upper electrode showerhead 12. Thus, plasma is generated from the at least one process gas that is supplied from the plasma processing space 10s. Therefore, the RF electric power supplying unit 30 may function as at least a part of a plasma generating unit that is configured to generate plasma from at least one process gas in the plasma processing chamber. In one embodiment, the RF electric power supplying unit 30 includes double RF generating units 31*a* and 31*b* and double matching circuits 32*a* and 32*b*. In one embodiment, the RF electric power supplying unit 30 is configured to supply a first RF signal from the first RF generating unit 31*a* to the lower electrode 111 via the first matching circuit 32*a*. For example, the first RF signal may have a frequency within a range of 27 MHz to 100 MHz.

In one embodiment, the RF electric power supplying unit 30 is configured to supply a second RF signal from the second RF generating unit 31*b* to the lower electrode 111 via the second matching circuit 32*b*. For example, the second RF signal may have a frequency within a range of 400 kHz to 13.56 MHz. Alternatively, a Direct Current (DC) pulse generating unit may be employed instead of the second RF generating unit 31*b*.

Although illustration thereof is omitted, in the present disclosure, another embodiment is considered. For example, the RF electric power supplying unit 30 may be configured to supply a first RF signal from an RF generating unit to the lower electrode 111, supply a second RF signal from another RF generating unit to the lower electrode 111, and supply a third RF signal from other RF generating unit to the lower electrode 111. Additionally, a DC voltage may be applied to the upper electrode showerhead 12.

Furthermore, in various embodiments, an amplitude of at least one RF signal (namely, first RF signal, second RF signal, etc.) may be pulsed or modulated. The amplitude modulation may include pulsing an amplitude of an RF signal between an ON-state and an OFF-state, or between two or more different ON-states.

An exhaust port 10*e* is formed in the chamber 10 for performing exhaust on an inner part thereof. In the chamber 10 according to the embodiment, the placing pedestal 11 is arranged in the center thereof, the single exhaust port 10*e* is arranged in a position that is in surroundings of the placing pedestal 11 and further is lower than the placement surface 11*a* of the placing pedestal 11, on which the substrate W is placed. For example, the exhaust port 10*e* is arranged in a bottom portion of the chamber 10, which forms surroundings of the placing pedestal 11. The exhaust system 40 may be connected to the exhaust port 10*e* that is arranged in a bottom portion of the chamber 10. The exhaust system 40 may include a pressure valve and a vacuum pump. The vacuum pump may include a turbo-molecular pump, a roughing pump, or a combination thereof.

Operations of the substrate processing apparatus 1 configured as described above are generally controlled by a controller 60. A user interface 61 and a storage 62 are connected to the controller 60.

The user interface 61 is constituted of an operation unit such as a keyboard for performing an input operation of a command from a process manager in order to manage the substrate processing apparatus 1, and/or a display unit such as a display that visualizes and displays an operation status of the substrate processing apparatus 1. The user interface 61 receives various operations. For example, the user interface 61 receives a predetermined operation that is an instruction for starting a plasma process.

The storage 62 is a storage device that stores therein various data. For example, the storage 62 is a storage device such as a hard disk, a Solid State Drive (SSD), and an optical disk. The storage 62 may be a data-rewritable semiconductor memory such as a Random Access Memory (RAM), a Flash Memory, and a Non Volatile Static Random Access Memory (NVSRAM).

The storage 62 stores therein an Operating System (OS) and various programs, which are to be executed by the controller 60. For example, the storage 62 stores therein various programs including a program for executing a process of a temperature controlling method to be mentioned later. Moreover, the storage 62 stores therein various data that is used in a program to be executed by the controller 60. For example, the storage 62 stores therein, as a recipe, a processing condition such as a gas type to be used in a plasma process and a flow volume of the gas, RF electric power to be supplied, a flow volume of heat transfer gas, and a temperature of the substrate W; for each temperature of a temperature-controlling medium and each process to be performed on the substrate W. The storage 62 may store therein other data in addition to the above-exemplified data.

The controller 60 is a device that is configured to control the substrate processing apparatus 1. An electric circuit may be employed as the controller 60, such as a Central Processing Unit (CPU) and a Micro Processing Unit (MPU), and/or an integrated circuit such as an Application Specific Integrated Circuit (ASIC) and a Field Programmable Gate Array (FPGA). The controller 60 includes an inner memory that stores therein programs and/or control data for prescribing various processing procedures so as to execute various processes with the use thereof. The various programs operate so that the controller 60 functions as various processing units. For example, the controller 60 includes a first acquisition unit 60*a*, a correction determining unit 60*b*, a second acquisition unit 60*c*, and an adjustment unit 60*d*.

The controller 60 controls the substrate processing apparatus 1 so as to execute a plurality of processes on the substrate W that is arranged on the placing pedestal 11 in the chamber 10, in accordance with a recipe stored in the storage 62.

Incidentally, as described above, in a case where repeatedly executing substrate processing, a part of the substrate processing apparatus 1 wears, and thus a temperature of the substrate W gradually changes over time. For example, in a case where the placement surface 11*a* of the placing pedestal 11 wears due to friction with the substrate W and/or plasma, heat transfer characteristics thereof changes, and thus a temperature of the substrate W changes over time. In a case where a temperature of the substrate W changes as described above, process results of processes may be affected in some cases.

Figure 2:
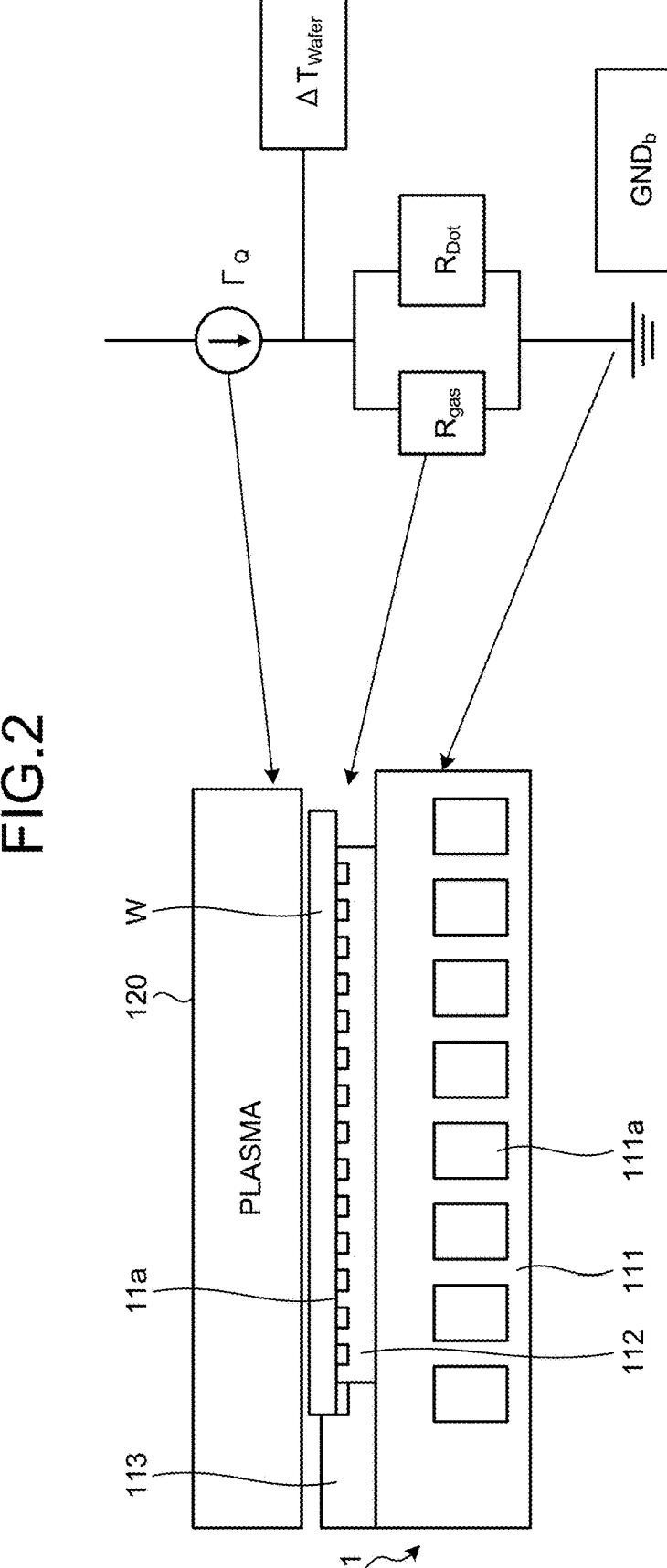
FIG. 2 is a diagram illustrating a change in heat transfer characteristics according to the embodiment.

FIG. 2 is a diagram illustrating a change in heat transfer characteristics according to the embodiment. In FIG. 2, the placing pedestal 11 is schematically illustrated in a left portion thereof, and a circuit indicating a heat flow of the placing pedestal 11 is schematically illustrated in a right portion thereof. In the placing pedestal 11, the electrostatic chuck 112 is arranged on the lower electrode 111. The flow path 111*a* is formed in the lower electrode 111. In the placing pedestal 11, the substrate W is placed on the placement surface 11*a* that is an upper surface of the electrostatic chuck 112. An uneven pattern such as dots is formed on the placement surface 11*a*. Heat transfer gas such as helium gas is accumulated in concave portions of the pattern on the placement surface 11*a*.

In a case where plasma 120 is generated in substrate processing, heat is input to the substrate W from the plasma 120, and thus a temperature of the substrate W rises. In the right portion of FIG. 2, input heat from the plasma 120 to the substrate W is indicated as heat $\Gamma_Q$. Heat of the substrate W is transferred to the placing pedestal 11 via unevenness in a pattern on the placement surface 11*a* of the placing pedestal 11. In the right portion of FIG. 2, a heat resistance of a convex portion on the placement surface 11$a$ is indicated as $R_{Dot}$, and a heat resistance of heat transfer gas of a concave portion on the placement surface 11$a$ is indicated as $R_{gas}$. A temperature-controlling medium flows through the flow path 111$a$, and a temperature of the lower electrode 111 is controlled to be constant. Heat transferred to the lower electrode 111 is discharged to the outside by the temperature-controlling medium. In the right portion of FIG. 2, a temperature of the lower electrode 111 is controlled to be constant by a temperature-controlling medium, and is indicated as $GND_b$.

In the substrate processing apparatus 1, input heat $\Gamma_Q$ to the substrate W from the plasma 120 changes over time due to deterioration and/or wear of the chamber 10. In the substrate processing apparatus 1, heat resistance $R_{Dot}$ changes over time due to wear of a pattern of the placement surface 11$a$. The input heat $\Gamma_Q$ and the heat resistance $R_{Dot}$ change over time, so that it is impossible to directly correct them.

In the substrate processing apparatus 1, it may be considered that a temperature of a temperature-controlling medium flowing into the flow path 111$a$ is changed so as to correct the temperature of the substrate W. In the substrate processing apparatus 1, in a case where a temperature of a temperature-controlling medium flowing into the flow path 111$a$ is changed, $GND_b$ is changed to be capable of offsetting a temperature of the substrate W.

However, change characteristics of the temperature of the substrate W differ for each process. For example, input heat $\Gamma_Q$ to the substrate W from the plasma 120 differs for each process. In this case, it is impossible to correct a temperature of the substrate W for each process by changing a temperature of the temperature-controlling medium alone.

Therefore, it may be considered that a flow volume of heat transfer gas is changed for each process by changing heat resistance $R_{gas}$, so as to correct a temperature of the substrate W for the corresponding process.

However, in a case where supply of heat transfer gas is excessively reduced, heat transfer occurs mainly between a convex portion of the placement surface 11$a$ and the substrate W, thereby leading to transcription of a surface shape of the placement surface 11$a$ to the substrate W. For example, in a case of plasma etching, a temperature of the substrate W differs between a convex portion and a concave portion in a pattern of the placement surface 11$a$, and thus a phenomenon occurs in which difference in an etching amount of the substrate W occurs between the convex portion and the concave portion in the pattern, thereby leading to transcription of a surface shape of the placement surface 11$a$ to the substrate W. In a case where supply of heat transfer gas is excessively increased, heat transfer gas leaks from surroundings of the substrate W, thereby leading to abnormality such as electric discharge.

Figure 3:
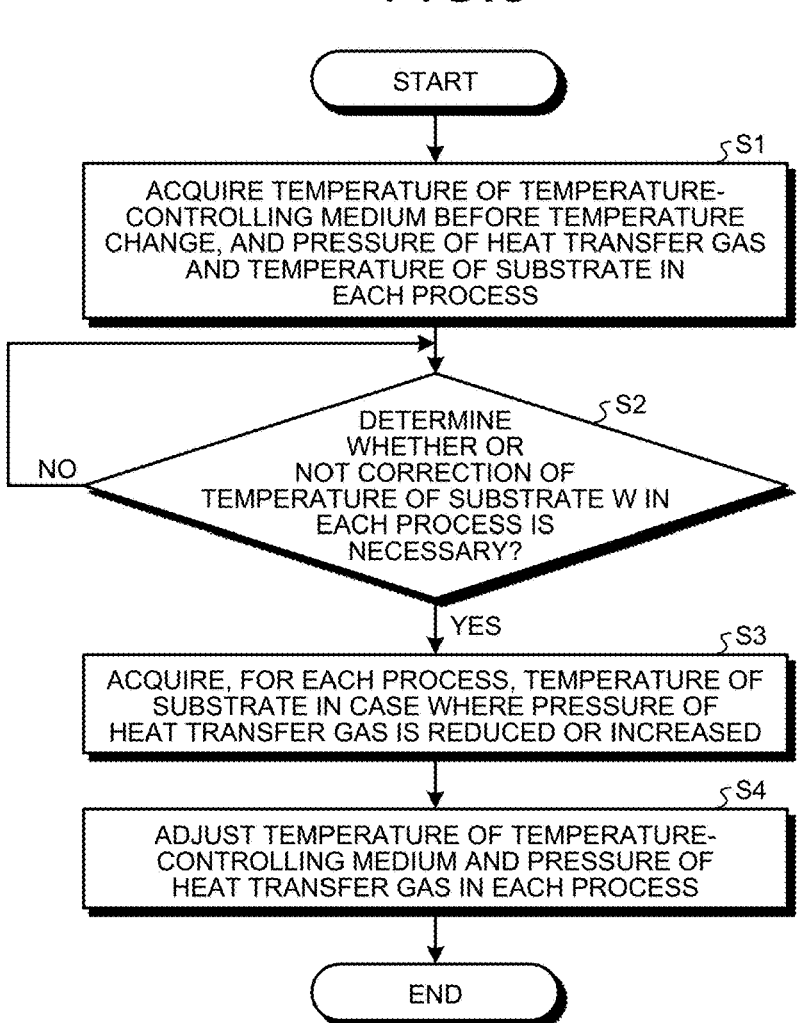
FIG. 3 is a flowchart illustrating one example of a flow of a temperature controlling method according to the embodiment.

Thus, the substrate processing apparatus 1 is configured to control the temperature of the substrate W for each process by a temperature controlling method according to the embodiment. FIG. 3 is a flowchart illustrating one example of a flow of the temperature controlling method according to the embodiment.

The first acquisition unit 60$a$ acquires a temperature of a temperature-controlling medium before a temperature change in executing a plurality of processes, and a pressure of heat transfer gas supplied from the heat transfer gas supplying unit 16 and a temperature of the substrate W in each of the processes (Step S1). For example, in executing a plurality of processes, the first acquisition unit 60$a$ acquires, in accordance with a recipe stored in the storage 62 for each of the processes, a pressure of heat transfer gas supplied from the heat transfer gas supplying unit 16 and a temperature of the substrate W at a timing that is a reference before the temperature change. A pressure of heat transfer gas may measure and acquire a flow volume of gas supplied from the heat transfer gas supplying unit 16, or may reads out and acquire a flow volume of heat transfer gas, which is stored in a recipe. A temperature of the substrate W may be also acquired by measuring an actual temperature of the substrate W, or may be also acquired by reading out a temperature of the substrate W, which is stored in a recipe.

Figure 4:
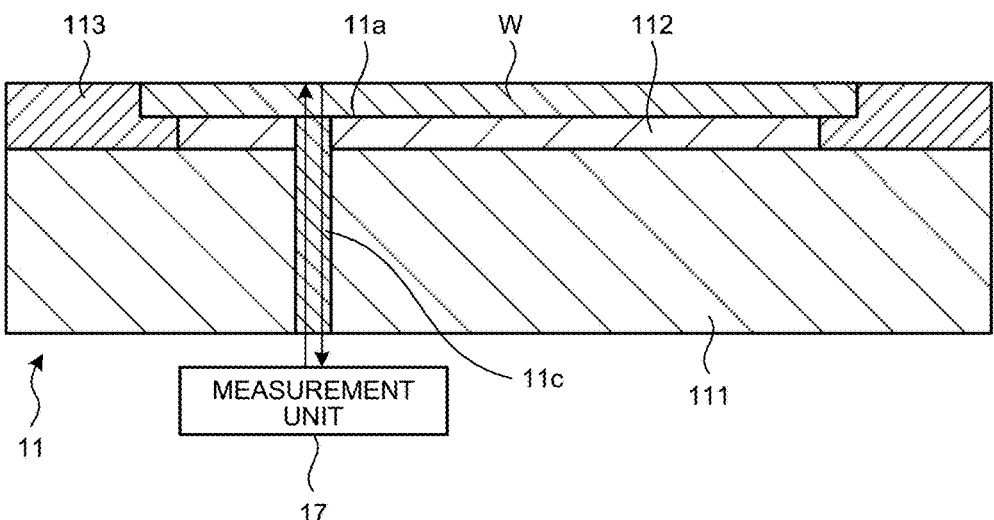
FIG. 4 is a schematic diagram illustrating one example of a configuration of a placing pedestal in the substrate processing apparatus according to the embodiment.

Herein, one example of a configuration in measuring a temperature of the substrate W will be explained. FIG. 4 is a schematic diagram illustrating one example of a configuration of the placing pedestal 11 in the substrate processing apparatus 1 according to the embodiment. A measurement unit 17 is arranged in a lower portion of the placing pedestal 11. The measurement unit 17 measures a temperature of the substrate W by using interfere of light. A penetration hole 11$c$ is formed in the placing pedestal 11, which penetrates up to the placement surface 11$a$ in correspondence with a position of the measurement unit 17. A member, which transmits light, is provided to the penetration hole 11$c$.

The measurement unit 17 includes therein a light source that emits light, a mirror, an optical element such as a splitter, and the like to be capable of irradiating interference light. For example, the measurement unit 17 splits an intermediate portion of an optical path of light, which is from generation thereof by the light source up to output to the outside, into two optical paths by using a half mirror or the like; changes one of the two optical path lengths with respect to the other of the two optical path lengths so as to change an optical path difference and further to cause them to interfere with each other; and irradiates light including various interfering waves whose optical path differences are not equal to each other. Note that the measurement unit 17 may include a plurality of light sources and further may control light emitted from each of the light sources by using a corresponding optical element so as to be capable of irradiating light including various interfering waves whose optical path differences are not equal to each other.

The measurement unit 17 detects signal intensities of light including various interfering waves that are reflected from the substrate W. In a case where being heated by action of plasma or the like, the substrate W expands and a refractive index thereof changes, and thus a position of an interference waveform differs between before and after a temperature change, thereby leading to a change in a peak-to-peak width of the interference waveform. The measurement unit 17 measures a peak-to-peak width of an interference waveform so as to detect a temperature. As the light source of the measurement unit 17, an arbitrary one may be used as long as interference can be measured. In a case where the substrate W is a semiconductor wafer, it is preferable that light is employed whose reflected light reflected from an intermediate length (ordinarily, approximately 800 $\mu$m to 1500 $\mu$m) between a front surface and a back surface of the semiconductor wafer does not generate interference. For example, it is preferable that low-coherence light is used. The low-coherence light means light whose coherence length is short. Preferably, the center wave length of the low-coherence light is 0.3 $\mu$m to 20 $\mu$m, for example, and more preferably, is 0.5 $\mu$m to 5 $\mu$m. Preferably, a coherence length is 0.1 $\mu$m to 100 $\mu$m, for example, and more preferably, is equal to or less than 3 $\mu$m.

Figure 5:
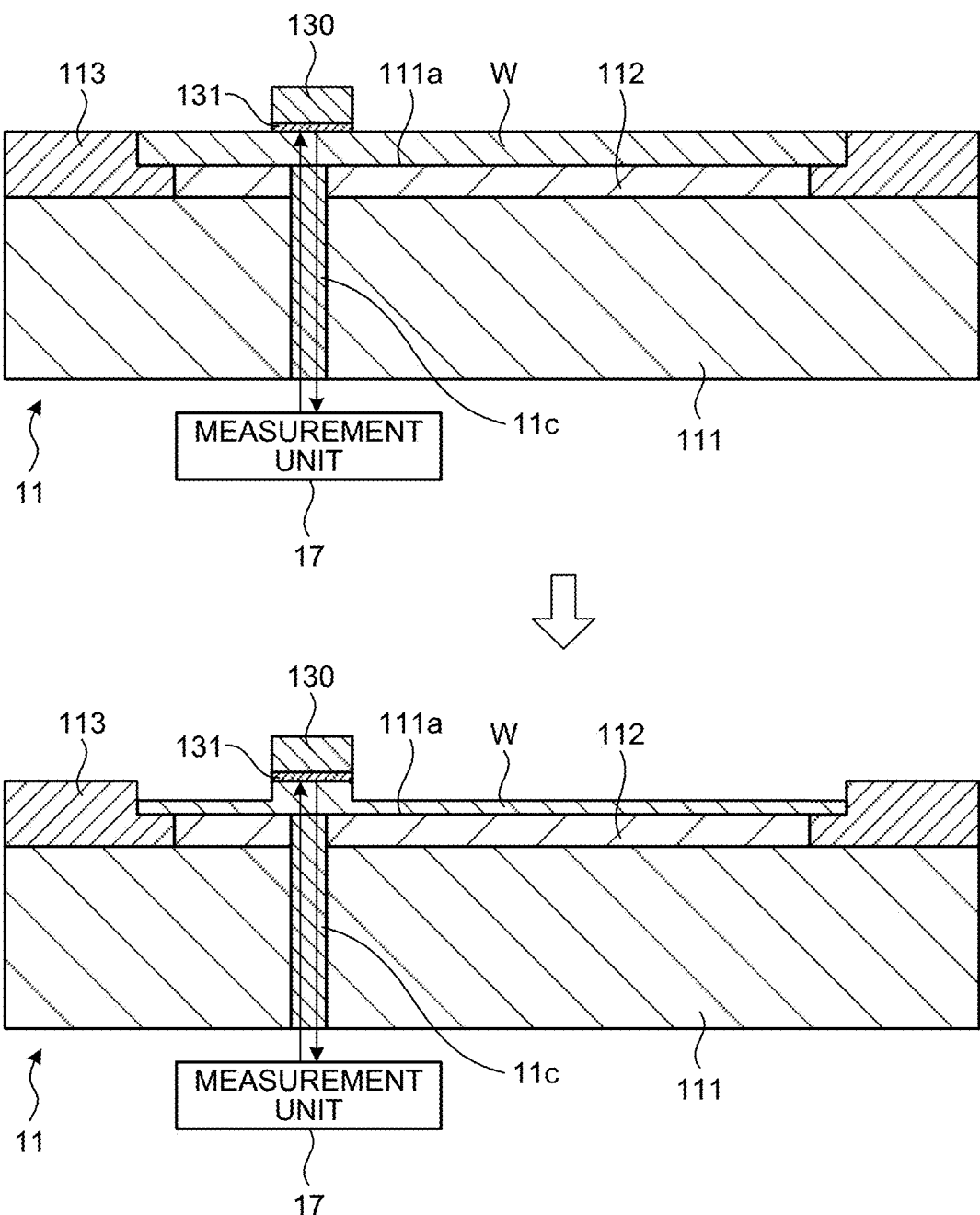
FIG. 5 is a diagram illustrating one example of decrease in a thickness of a substrate caused by etching according to the embodiment.
Figure 6:
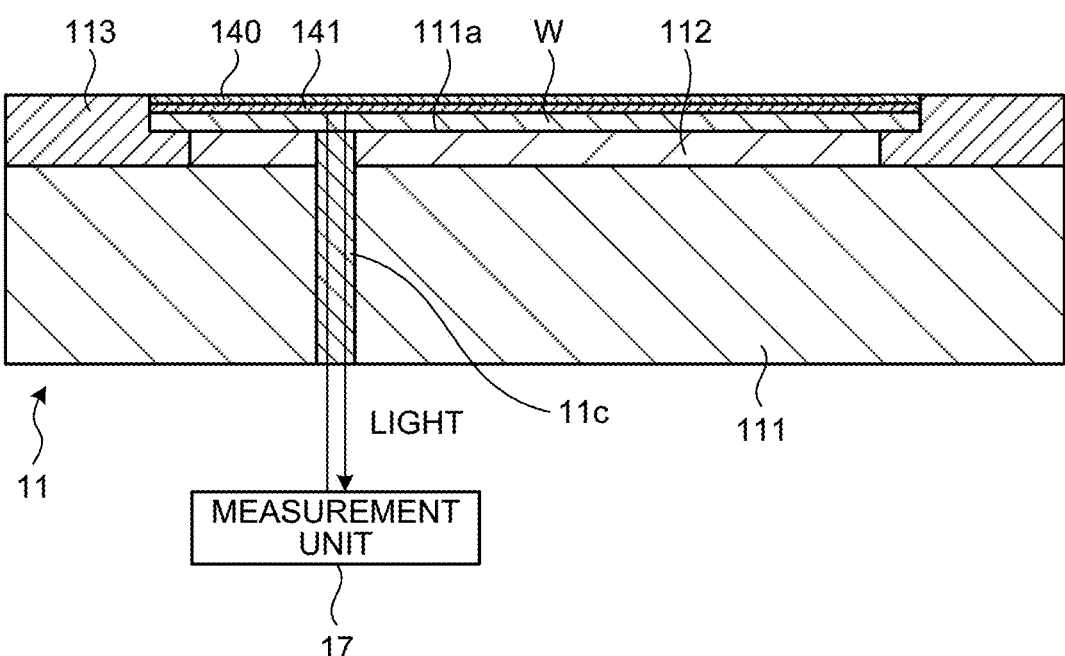
FIG. 6 is a diagram illustrating another example of protection of a substrate according to the embodiment.

In a case where a process to be executed on the substrate W is plasma etching or sputtering, the substrate W wears from an upper surface side thereof, and thus a thickness thereof decreases. FIG. 5 is a diagram illustrating one example of decrease in a thickness of the substrate W caused by etching according to the embodiment. When a thickness of the substrate W decreases, an error in a measured temperature occurs. Thus, the substrate W for temperature measurement such as a dummy wafer may be used. The substrate W may be protected such that a temperature measurement position does not wear, on which light emitted from the measurement unit 17 makes incident. The substrate W illustrated in FIG. 5 is provided with a chip 130 for protection in a temperature measurement position on which light emitted from the measurement unit 17 makes incident. The chip 130 may be provided with a reflection film 131 that is arranged on a side of the substrate W so as to reflect light. Thus, it is possible to prevent a temperature measurement position from wearing even in a case where a process of plasma etching or sputtering is executed on the substrate W so that the substrate W wears from an upper surface side thereof. FIG. 6 is a diagram illustrating another example of protection of the substrate W according to the embodiment. A reflective film 141 and a protective film 140 are formed on an upper surface of the substrate W illustrated in FIG. 6. The protective film 140 may be any film as long as an upper surface of the substrate W is protected from plasma etching or sputtering. It is sufficient that the protective film 140 protects an upper surface of the substrate W only for a temperature measurement period, and thus may wear. In a case where the protective film 140 wears, a substrate is replaced with the new substrate W so as to measure a temperature.

In measuring a temperature of the substrate W, a process substrate on which a plasma process such as etching and sputtering is actually executed may be used, or a dummy substrate may be used. There has been known a case where a plasma state when plasma is being generated differs depending on a surface state of a substrate, in this case, plasma heat input to the substrate also changes in some cases. Thus, in a case where the protective film 140 is formed on an upper surface of the substrate W as illustrated in FIG. 6, it is desirable that a material of the protective film 140 is a material that is equal to a material arranged on a surface of a process substrate on which a plasma process is to be executed, or a material that is similar thereto. For example, in a case where patterned photoresist is provided, it is desirable that a material of the protective film 140 is a similar photoresist or a blanket film made of an organic material, and further in a case where an opening ratio of patterning is large and an exposed area of a silicon oxide film or a silicon nitride film, which is a film to be etched, is large, it is desirable that a material of the protective film 140 is a blanket film of a silicon oxide film or a silicon nitride film. Thus, even in a case where a dummy substrate is employed for the substrate W, it is possible to measure an accurate temperature while simulating a case where a plasma process is actually executed.

A configuration for measuring a temperature of the substrate W is not limited to the above-mentioned, any configuration may be employed as long as a temperature of the substrate W can be measured. For example, a temperature sensor that is capable of measuring a temperature, such as a thermocouple, may be provided to the placement surface 11$a$ of the placing pedestal 11 so as to measure a temperature of the substrate W. Moreover, an infrared sensor may be provided to the upper electrode showerhead 12 so as to measure a temperature from infrared light that is radiated from the substrate W.

Returning to FIG. 3. The correction determining unit 60$b$ determines whether or not correction of a temperature of the substrate W in each process is necessary (Step S2). For example, the correction determining unit 60$b$ causes the measurement unit 17 to periodically measure, at a predetermined timing, a temperature of the substrate W in each process. The timing for measuring a temperature is set to a timing for each time the predetermined number of substrates W are processed, for example. The correction determining unit 60$b$ compares, for each process, a measured temperature of the substrate W and the temperature of the substrate W that is acquired in Step S1 with each other so as to obtain a temperature change of the substrate W for each process. The correction determining unit 60$b$ determines, for each process, whether or not a temperature change of the substrate W exceeds a predetermined threshold; and in a case where a temperature change of the substrate W exceeds the threshold in one of the processes, determines that correction of a temperature of the substrate W is necessary. In a case where substrate processing is repeatedly executed on the substrate W and a temperature change occurs in the substrate W for each process, the correction determining unit 60$b$ may determine that correction of a temperature of the substrate W is necessary without measuring a temperature of the substrate W each time when a predetermined number of substrates are processed which causes a temperature change in the substrate W.

In a case where correction of a temperature is not necessary (Step S2: No), the correction determining unit 60$b$ repeatedly executes determination of Step S2.

In a case where correction of a temperature is necessary (Step S2: Yes), the second acquisition unit 60$c$ acquires, for each process n, a temperature of the substrate W in a case where a pressure of heat transfer gas is reduced and a temperature of the substrate W in a case where a pressure of heat transfer gas is increased (Step S3).

The adjustment unit 60$d$ adjusts a temperature of a temperature-controlling medium supplied from the temperature-controlling medium supply unit 14 and a pressure of heat transfer gas that is supplied from the heat transfer gas supplying unit 16 for each process, so as to correct a change in a temperature of the substrate W for each process (Step S4).

Figure 7:
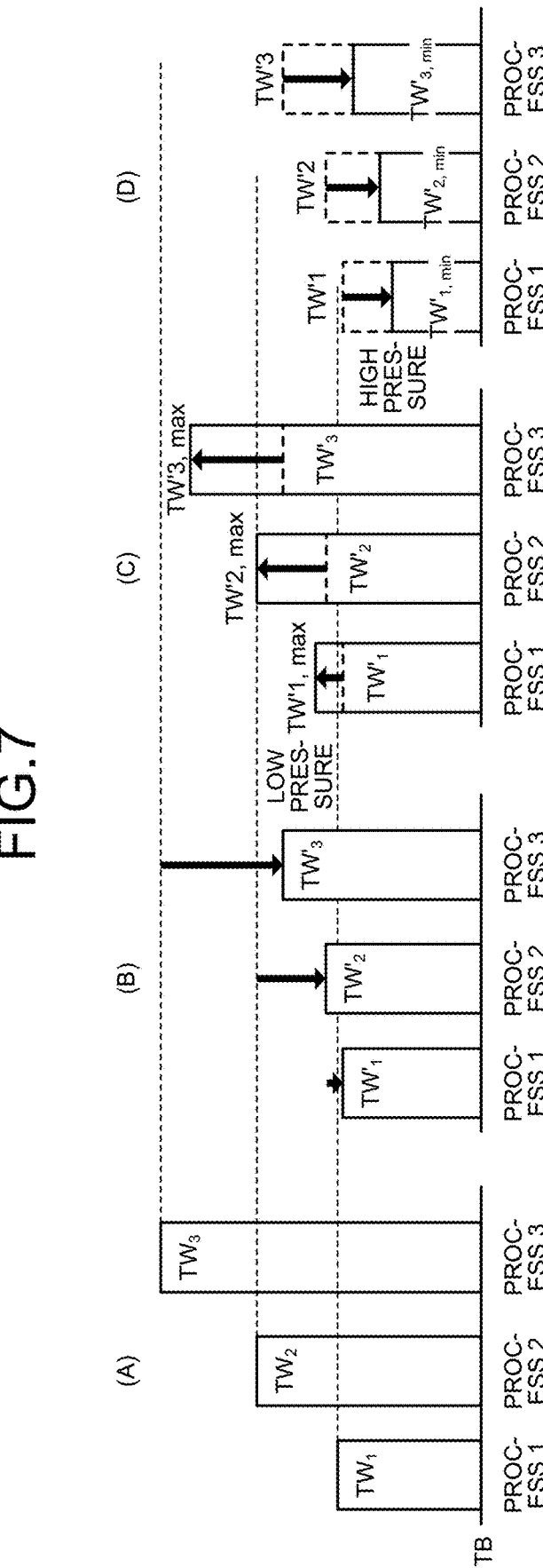
FIG. 7 is a diagram illustrating a temperature of a substrate, which is acquired by the temperature controlling method according to the embodiment.

FIG. 7 is a diagram illustrating a temperature of the substrate W, which is acquired by the temperature controlling method according to the embodiment. In (A) to (D) illustrated in FIG. 7, there are schematically illustrated a change in a temperature of the substrate W for each process by the temperature controlling method according to the embodiment. In FIG. 7, a case will be explained in which three processes 1 to 3 are executed on the substrate W. Assume that recipes of the processes 1 to 3 are different from each other, and further input heats $\Gamma_Q$ from the plasma 120 to the substrate W are different from each other.

In the above-mentioned Step S1, the first acquisition unit 60$a$ acquires a temperature TB of a temperature-controlling medium which is a reference before a temperature change in executing a plurality of processes n (n is identifier of process, and further is natural number that is greater than one) in which heat input to the substrate W occurs, and further acquires, for each of the processes n, a pressure $P_n$ of heat transfer gas that is supplied from the heat transfer gas supplying unit 16 and the temperature $TW_n$ of the substrate W. In FIG. 7(A), there are illustrated the temperatures $TW_1$ to $TW_3$ of the substrate W in the processes 1 to 3.

In the above-mentioned Step S2, the correction determining unit 60$b$ determines, for each of the processes n, whether or not a temperature change of the substrate W exceeds a predetermined threshold, and further in a case where a temperature change of the substrate W exceeds the threshold in one of the processes n, determines that correction of a temperature of the substrate W is necessary. In FIG. 7(B), there are illustrated a case where temperatures of the substrate W in the processes 1 to 3 change into the temperature $TW'_1$ to $TW'_3$ over time. In a case where a temperature change of the substrate W exceeds a threshold in the processes 1 to 3, the correction determining unit 60b determines that correction of a temperature of the substrate W is necessary.

In the above-mentioned Step S3, the second acquisition unit 60c acquires, for each of the processes n, a temperature of the substrate W in a case where a pressure of heat transfer gas is reduced, and a temperature of the substrate W in a case where a pressure of heat transfer gas is increased. For example, the second acquisition unit 60c acquires, for each of the processes n while using a temperature of the temperature-controlling medium as the temperature TB, the temperature $TW'_{n,max}$ of the substrate W in the corresponding process n, in a case where a pressure of heat transfer gas supplied from the heat transfer gas supplying unit 16 within a range in which transcription of a surface shape of the placement surface 11a to the substrate W does not occur, is reduced to be lower than a pressure $P_n$; and the temperature $TW'_{n,max}$ in of the substrate W in the corresponding process n in a case where a pressure of heat transfer gas supplied from the heat transfer gas supplying unit 16 within a range in which abnormality due to leakage of heat transfer gas does not occur is increased to be greater than the pressure $P_n$.

In the substrate processing apparatus 1, in a case where a pressure of heat transfer gas supplied from the heat transfer gas supplying unit 16 is reduced, heat transfer caused by the heat transfer gas to the substrate W in a concave portion of the placement surface 11a of the placing pedestal 11 decreases, and thus a temperature of the substrate W rises. On the other hand, in the substrate processing apparatus 1, in a case where a pressure of heat transfer gas supplied from the heat transfer gas supplying unit 16 is increased, heat transfer caused by the heat transfer gas to the substrate W in a concave portion of the placement surface 11a of the placing pedestal 11 increases, and thus a temperature of the substrate W decreases.

Figure 8:
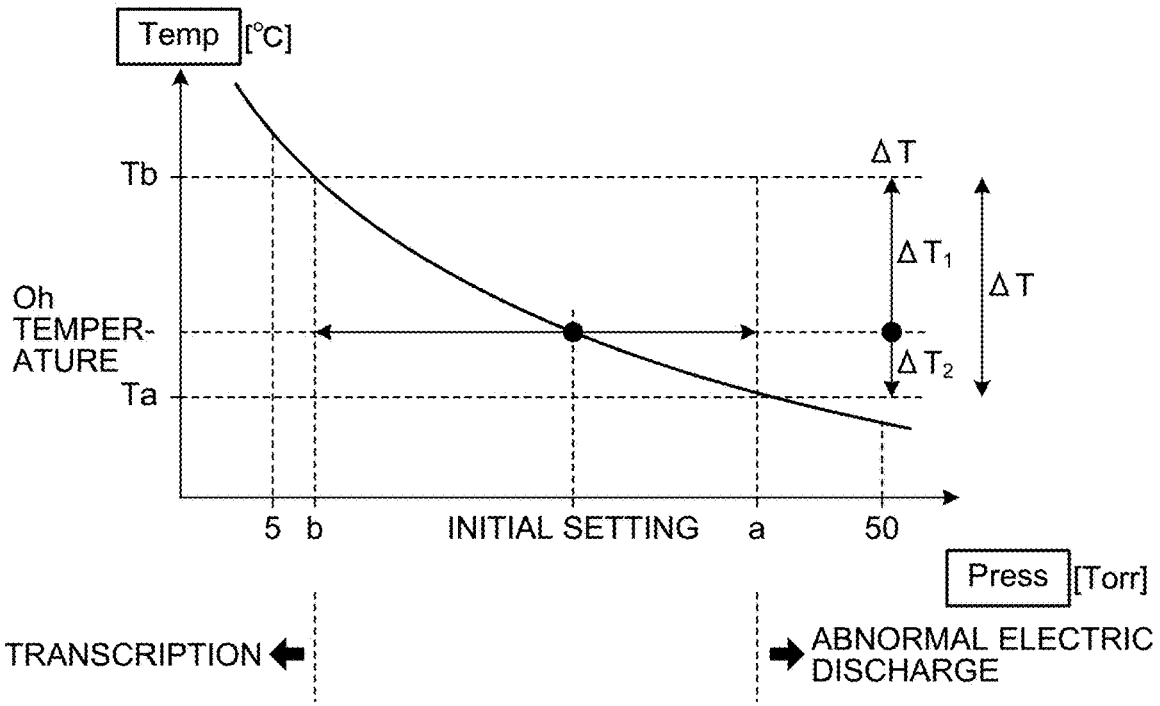
FIG. 8 is a diagram illustrating one example of relation between a pressure of heat transfer gas and a temperature of a substrate according to the embodiment.

FIG. 8 is a diagram illustrating one example of relation between a pressure of heat transfer gas and a temperature of the substrate W according to the embodiment. In FIG. 8, there is illustrated a graph that indicates relation between a pressure of heat transfer gas and a temperature of the substrate W. Assume that the heat transfer gas supplying unit 16 is capable of supplying heat transfer gas within a pressure control range of 5 Torr to 50 Torr, for example. A temperature of the substrate W decreases in accordance with increase in a pressure of the heat transfer gas supplied from the heat transfer gas supplying unit 16. However, in a case where supply of the heat transfer gas is excessively reduced, heat transfer is executed mainly between a convex portion of the placement surface 11a and the substrate W, so that transcription of a surface shape of the placement surface 11a to the substrate W occurs. In a case where supply of heat transfer gas is excessively increased, the heat transfer gas leaks from surroundings of the substrate W, thereby leading to abnormality such as electric discharge. In FIG. 8, in a case where a pressure of heat transfer gas is lower than a pressure b, transcription occurs, and a temperature of the substrate W becomes the temperature Tb. In a case where a pressure of the heat transfer gas is greater than a pressure a, abnormality of electric discharge occurs, and a temperature of the substrate W becomes the temperature Ta.

Figure 9:
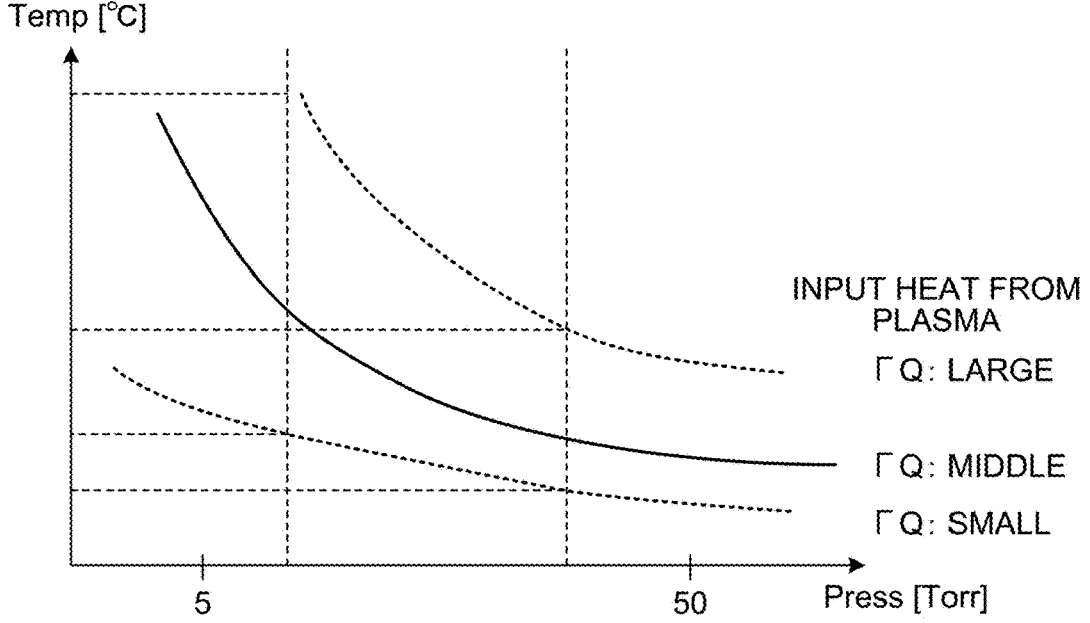
FIG. 9 is a diagram illustrating one example of a change in relation, caused by a heat input quantity into a substrate from plasma, between a pressure of heat transfer gas and a temperature of the substrate according to the embodiment.

Relation between a pressure of heat transfer gas and a temperature of the substrate W changes due to a heat input quantity from the plasma 120 to the substrate W. FIG. 9 is a diagram illustrating one example of a change in relation, caused by a heat input quantity into the substrate W from the plasma 120, between a pressure of heat transfer gas and a temperature of the substrate W according to the embodiment. In a case where input heat $\Gamma_Q$ from the plasma 120 to the substrate W is large, a curve line indicating relation between a pressure of heat transfer gas and a temperature of the substrate W moves upward in whole.

The second acquisition unit 60c sequentially reduces, for each of the processes n, a pressure of heat transfer gas supplied from the heat transfer gas supplying unit 16 within a range in which transcription of a surface shape of the placement surface 11a to the substrate W does not occur; and further causes the measurement unit 17 to measure the temperature $TW'_{n,max}$ of the substrate W for each of the processes n, and acquires the measured temperature. In FIG. 7(C), for each of the processes 1 to 3, there are illustrated the temperatures $TW'_{1,max}$ to $TW'_{3,max}$ of the substrate W in a case where a pressure of heat transfer gas supplied from the heat transfer gas supplying unit 16 is reduced to be lower than pressures P1 to P3 within a range in which transcription of a surface shape of the placement surface 11a to the substrate W does not occur. The second acquisition unit 60c causes the measurement unit 17 to execute measurement so as to acquire $W''_{1,max}$ to $TW'_{3,max}$. It is sufficient that a pressure of the heat transfer gas is reduced within a range in which transcription of the substrate W does not occur, and it is unnecessary that the pressure is reduced to a pressure of a boundary at which the transcription does not occur. Moreover, a value of a pressure of the heat transfer gas, which is to be reduced, may be preliminarily decided by an experiment or the like within a range in which transcription to the substrate W does not occur.

The second acquisition unit 60c sequentially increases, for each of the processes n, a pressure of heat transfer gas supplied from the heat transfer gas supplying unit 16 within a range in which abnormality due to leakage of the heat transfer gas does not occur; and further causes the measurement unit 17 to measure the temperature $TW'_{n,min}$ of the substrate W for each of the processes n, and acquires the measured temperature. In FIG. 7 (D), for each of the processes 1 to 3, there are illustrated the temperatures $TW'_{1,min}$ to $TW'_{3,min}$ of the substrate W in a case where a pressure of heat transfer gas supplied from the heat transfer gas supplying unit 16 is increased to be greater than pressures P1 to P3 within a range in which abnormality due to leakage of the heat transfer gas does not occur. The second acquisition unit 60c causes the measurement unit 17 to execute measurement so as to acquire $W'_{1,min}$ to $TW'_{3,min}$. It is sufficient that a pressure of the heat transfer gas is increased within a range in which abnormality due to leakage of the heat transfer gas does not occur, and it is unnecessary that the pressure is increased up to a pressure of a boundary at which the abnormality does not occur. Moreover, a value of a pressure of the heat transfer gas, which is to be increased, may be preliminarily decided by an experiment or the like within a range in which the abnormality does not occur.

Figure 10:
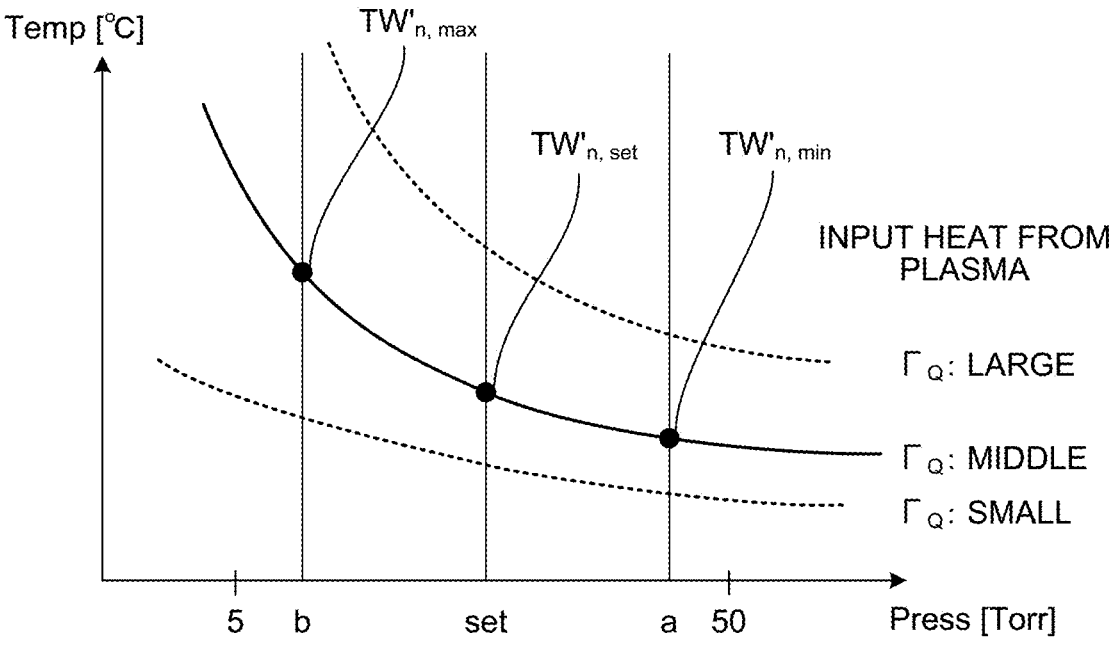
FIG. 10 is a diagram illustrating one example of acquisition of temperatures of a substrate from relationship data according to the embodiment.

The case is exemplified in which the second acquisition unit 60c actually reduces or increases a pressure of heat transfer gas supplied from the heat transfer gas supplying unit 16 so as to cause the measurement unit 17 to measure the temperatures $TW'_{n,max}$ and $TW'_{n,min}$ of the substrate W, and acquires the measured temperatures; however, not limited thereto. The second acquisition unit $60c$ may acquire the temperatures $TW'_{n,max}$ and $TW'_{n,min}$ of the substrate W from relation between a pressure of heat transfer gas and a temperature of the substrate W. For example, for each process, relationship data indicating relation between a pressure of heat transfer gas and a temperature of the substrate W, which is exemplified in FIG. 8, is stored in the storage 62. The relationship data may be a relation formula obtained by modeling relation between a pressure of heat transfer gas and a temperature of the substrate W by using a mathematical formula, or may be data obtained by storing temperatures of the substrate W at respective pressures of the heat transfer gas. The second acquisition unit 60c may read out, for each process, relationship data corresponding to a corresponding process from the storage 62 so as to acquire the temperatures $TW'_{n,max}$ and $TW'_{n,min}$ of the substrate W in a case where actually reducing and increasing a pressure of the heat transfer gas in accordance with relationship data corresponding to the corresponding process. FIG. 10 is a diagram illustrating one example of acquisition of the temperatures $TW'_{n,max}$ and $TW'_{n,min}$ of the substrate W from relationship data according to the embodiment. In FIG. 10, there is illustrated a graph that indicates relation between a pressure of heat transfer gas and a temperature of the substrate W. The second acquisition unit 60c acquires the temperature $TW'_{n,max}$ of the substrate W at the pressure b and the temperature $TW'_{n,min}$ of the substrate W at the pressure a.

In the above-mentioned Step S4, the adjustment unit 60d adjusts a temperature of a temperature-controlling medium and a pressure of heat transfer gas supplied from the heat transfer gas supplying unit 16 so as to correct a change in a temperature of the substrate W in each process. For example, the adjustment unit 60d adjusts a temperature of a temperature-controlling medium to be the temperature TB" that satisfies the following formula (1).

$$TB+\max(TW_n-TW'_{n,max})TB'' \leq TB+\min(TW_n-TW'_{n,min}) \tag{1}$$

Herein, max $(TW_n-TW'_{n,max})$ is a function for obtaining the maximum value of values of $TW_n-TW'_{n,max}$ in the processes n. Furthermore, min $(TW_n-TW'_{n,min})$ is a function for obtaining the minimum value of values of $TW_n-TW'_{n,min}$ in the processes n.

Figure 11:
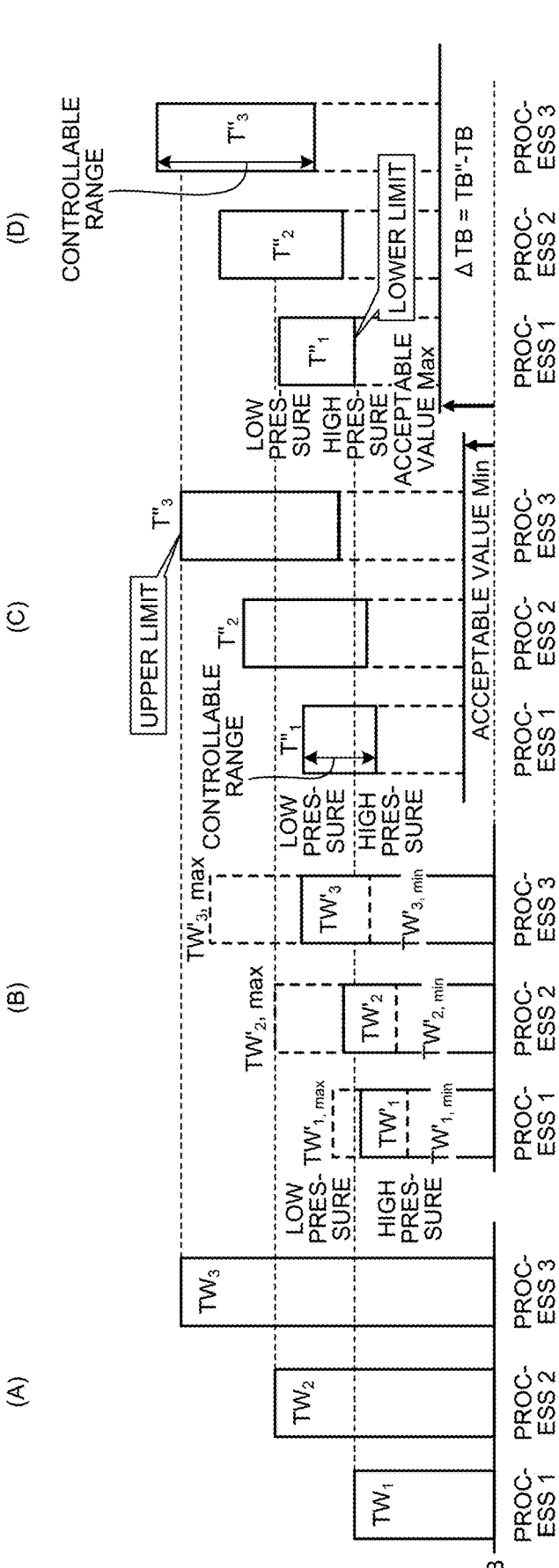
FIG. 11 is a diagram illustrating adjustment of a temperature of a temperature-controlling medium in the temperature controlling method according to the embodiment.

FIG. 11 is a diagram illustrating adjustment of a temperature of a temperature-controlling medium in the temperature controlling method according to the embodiment. In FIG. 11, a case will be explained in which the three processes 1 to 3 are executed on the substrate W. In FIG. 11 (A), there are illustrated the temperatures $TW_1$ to $TW_3$ of the substrate W in the processes 1 to 3, which are acquired in Step S1. In FIG. 11 (B), there are illustrated the temperatures $TW_1$ to $TW_3$ of the substrate W in the processes 1 to 3, which change over time; and the ranges from the temperatures $TW'_{1,max}$ to $TW'_{3,max}$ to the temperatures $TW'_{1,min}$, to $TW_{3,min}$ of the substrate W in the processes 1 to 3, which are illustrated in FIG. 7 (B) to (D).

In the processes 1 to 3, temperatures of the substrate W, which can be raised by reducing heat transfer gas within a range in which transcription of a surface shape in the placement surface 11a to the substrate W does not occur, are the temperatures $TW'_{1,max}$ to $TW'_{3,max}$. In each of the processes 1 to 3, a temperature of the temperature-controlling medium is raised by ΔTB so as to raise each of the temperatures $TW'_{1,max}$ to $TW'_{3,max}$ of the substrate W by ΔTB. In FIG. 11 (C), there are illustrated, as the temperatures $TW''_1$ to $TW''_3$, temperatures obtained by raising, by ΔTB, the temperatures $TW'_{1,max}$ to $TW'_{3,max}$ of the substrate W. In a case where the temperatures $TW''_1$ to $TW''_3$ of the substrate W in the processes 1 to 3 obtained by raising, by ΔTB, a temperature of the temperature-controlling medium are respectively equal to or more than $TW_1$ to $TW_3$; a temperature of the substrate W can be corrected in the processes 1 to 3 by adjustment of a pressure of the heat transfer gas within a range in which the transcription to the substrate W does not occur. In this case, it is necessary that ΔTB satisfies the following formula (2).

$$\max(TW_n-TW'_{n,max}) \leq \Delta TB \tag{2}$$

In the processes 1 to 3, temperatures of the substrate W, which can be reduced by increasing heat transfer gas within a range in which abnormality such as electric discharge does not occur, are the temperatures $TW'_{1,min}$ to $TW'_{3,min}$. In each of the processes 1 to 3, a temperature of the temperature-controlling medium is raised by ΔTB so as to raise each of the temperatures $TW'_{1,min}$ to $TW'_{3,min}$ of the substrate W by ΔTB. In FIG. 11 (D), there are illustrated, as the temperatures $TW''_1$ to $TW''_3$, temperatures obtained by raising, by ΔTB, the temperatures $TW'_{1,min}$ to $TW'_{3,min}$ of the substrate W. In a case where the temperatures $TW''_1$ to $TW''_3$ of the substrate W in the processes 1 to 3 obtained by raising, by ΔTB, a temperature of the temperature-controlling medium are respectively equal to or less than $TW_1$ to $TW_3$; a temperature of the substrate W can be corrected in the processes 1 to 3 by adjustment of a pressure of the heat transfer gas within a range in which the abnormality such as electric discharge does not occur. In this case, it is necessary that ΔTB satisfies the following formula (3).

$$\Delta TB \leq \min(TW_n-TW'_{n,min}) \tag{3}$$

The formulae (2) and (3) indicate a correction range of a temperature of the temperature-controlling medium. The corrected temperature TB" of the temperature-controlling medium is the uncorrected temperature TB of the temperature-controlling medium+ΔTB. Thus, the above-mentioned formula (1) is obtained from the formulae (2) and (3).

In a case where a temperature of the temperature-controlling medium is within the range of the above-mentioned formula (1), it is possible to correct a temperature of the substrate W by adjusting a pressure of heat transfer gas in each process without occurrence of transcription of a surface shape of the placement surface 11a to the substrate W or abnormality such as electric discharge.

In a case where a temperature of a temperature-controlling medium is set to a temperature close to one of both edges of the range of the temperature TB" indicated in the formula (1), a range capable of adjusting a pressure of heat transfer gas is narrow. Thus, it is preferable that the adjustment unit 60d adjusts a temperature of a temperature-controlling medium to a temperature close to the center of the range of the temperature TB" indicated in the formula (1). For example, the adjustment unit 60d adjusts a temperature of a temperature-controlling medium to a temperature close to the center of the range of the temperature TB" indicated in the formula (1).

Figure 12:
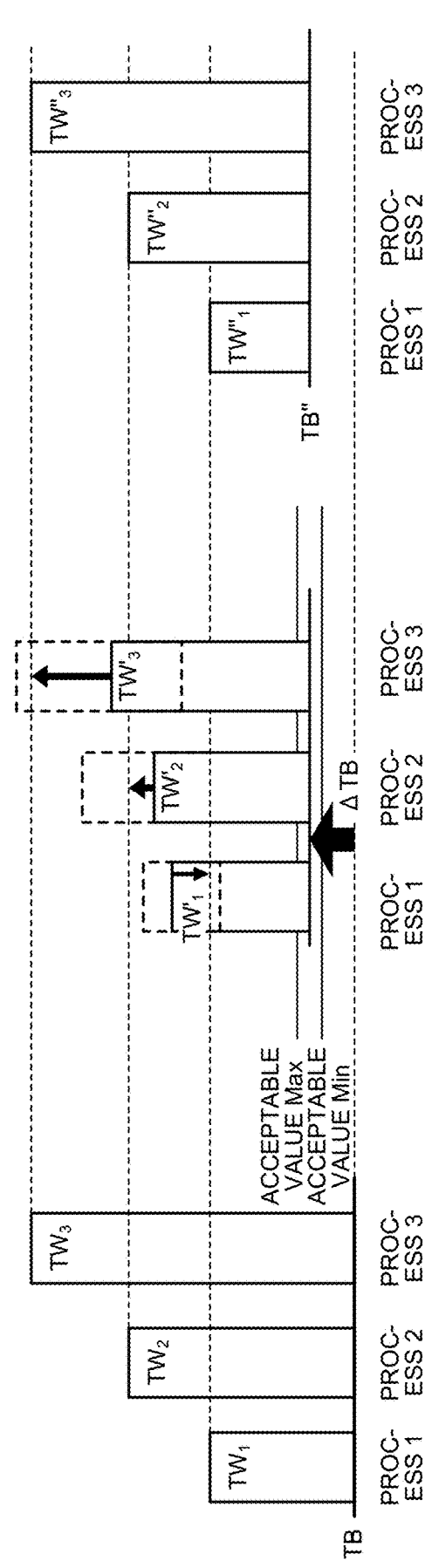
FIG. 12 is a diagram illustrating adjustment of a pressure of heat transfer gas in the temperature controlling method according to the embodiment.

FIG. 12 is a diagram illustrating adjustment of a pressure of heat transfer gas in the temperature controlling method according to the embodiment. In FIG. 12, a case will be explained in which the three processes 1 to 3 are executed on the substrate W. In FIG. 12 (A), there are indicated the temperatures $TW_1$ to $TW_3$ of the substrate W in the processes 1 to 3, which are acquired in Step S1. In FIG. 12 (B), there is indicated a state where a temperature of a temperature-controlling medium is raised by $\Delta$TB so as to adjust the temperature to the temperature TB''. In a case where the temperature-controlling medium is adjusted to the temperature TB'', temperatures of the substrate W in the processes 1 to 3 become the temperatures $TW'_1$ to $TW'_3$.

The adjustment unit 60d adjusts, for each of the processes n, a pressure of heat transfer gas supplied from the heat transfer gas supplying unit 16 such that a corresponding temperature of the substrate W is the temperature $TW_n$. For example, the adjustment unit 60d causes, for each of the processes n, the measurement unit 17 to measure a temperature of the substrate W, and further adjusts a pressure of heat transfer gas supplied from the heat transfer gas supplying unit 16 such that a corresponding temperature of the substrate W is the temperature $TW_n$. In FIG. 12 (C), there are indicated a state where a pressure of heat transfer gas is adjusted for each of the processes n. The temperatures $TW''_1$ to $TW''_3$ of the substrate W in the processes 1 to 3, which are obtained by adjusting a pressure of heat transfer gas, are the temperatures $TW_1$ to $TW_3$, respectively.

Note that the case is exemplified in which the adjustment unit 60d causes the measurement unit 17 to measure a temperature of the substrate W, and further adjusts a pressure of heat transfer gas supplied from the heat transfer gas supplying unit 16; however, not limited thereto. The adjustment unit 60d may adjust a pressure of the heat transfer gas supplied from the heat transfer gas supplying unit 16 by using relationship data that indicates relation between a pressure of the heat transfer gas and a temperature of the substrate W. For example, the adjustment unit 60d may read out, for each process, relationship data corresponding to the corresponding process from the storage 62, and further may adjust a pressure of heat transfer gas supplied from the heat transfer gas supplying unit 16 such that a temperature of the substrate W becomes the temperature $TW_n$ on the basis of the relationship data corresponding to the corresponding process.

As described above, the temperature controlling method according to the embodiment includes acquiring: a temperature TB of a temperature-controlling medium before a temperature change during execution of a plurality of processes n in each of which heat is input to the substrate W placed on the placement surface 11a of a stage (placing pedestal 11), wherein the placement surface 11a on which the substrate W is placed is formed on the stage, the flow path 111a through which the temperature-controlling medium having an adjusted temperature flows is formed in the stage, and the discharge port lib via which heat transfer gas is discharged toward the placement surface 11a is formed in the stage; and for each of the processes n, a pressure $P_n$ of heat transfer gas supplied to the discharge port lib and a temperature $TW_n$ of the substrate W. The temperature controlling method according to the embodiment further includes acquiring: for each of the processes n after the temperature change while using a temperature of the temperature-controlling medium as the temperature TB, a temperature $TW'_{n,max}$ of the substrate W in the corresponding process n in a case where a pressure of the heat transfer gas supplied to the discharge port lib is reduced to be lower than the pressure $P_n$; and a temperature $TW'_{n,min}$ of the substrate W in the corresponding process n in a case where a pressure of the heat transfer gas supplied to the discharge port 11b is increased to be greater than the pressure $P_n$.

The temperature controlling method according to the embodiment further includes adjusting a temperature of the temperature-controlling medium to a temperature TB'' that satisfies the above formula (1); and for each of the processes n, adjusting a pressure of the heat transfer gas supplied to the discharge port lib such that a temperature of the substrate W is the temperature $TW_n$. Thus, the temperature controlling method according to the embodiment is capable of correcting, in each of the processes n, a change in a temperature of the substrate W during execution of the plurality of processes n on the substrate W.

In the temperature controlling method according to the embodiment, the acquiring the temperature $TW'_{n,max}$ and the temperature $TW'_{n,min}$ includes acquiring: within a range in which transcription of a surface shape of the placement surface 11a to the substrate W does not occur, for each of the processes n after the temperature change while using a temperature of the temperature-controlling medium as the temperature TB, the temperature TW'n,max of the substrate W in the corresponding process n in a case where a pressure of the heat transfer gas supplied to the discharge port 11b is reduced to be lower than the pressure $P_n$; and within a range in which abnormality due to leakage of the heat transfer gas does not occur, the temperature $TW'_{n,min}$ of the substrate W in the corresponding process n in a case where a pressure of the heat transfer gas supplied to the discharge port 11b is increased to be greater than the pressure $P_n$.

Thus, the temperature controlling method according to the embodiment includes adjusting a pressure of the heat transfer gas within a range in which transcription of a surface shape of the placement surface 11a to the substrate W and abnormality due to leakage of the heat transfer gas do not occur, so that it is possible to correct a change in a temperature of the substrate W in each of the processes n.

In the temperature controlling method according to the embodiment, the acquiring the temperature $TW_n$ and the acquiring the temperature $TW'_{n,max}$ and the temperature $TW'_{n,min}$ includes: causing the measurement unit 17 that measures a temperature of the substrate W to measure a temperature of the substrate W; and acquiring the measured temperature. Thus, the temperature controlling method according to the embodiment is capable of actually measuring a temperature of the substrate W, and further acquiring the temperature $TW_n$, the temperature $TW'_{n,max}$, and the temperature $TW'_{n,min}$.

In the temperature controlling method according to the embodiment, the acquiring the temperature TB of the temperature-controlling medium and the temperature $TW_n$ includes: acquiring a temperature of the temperature-controlling medium and a temperature of the substrate W in each of the processes n from a recipe that is stored as a processing condition. In the temperature controlling method according to the embodiment, the acquiring the temperature $TW'_{n,max}$ and the temperature $TW'_{n,min}$ includes: by using relationship data that indicates relation between a pressure of the heat transfer gas and a temperature of the substrate W for each of the processes n, the temperature $TW'_{n,max}$ of the substrate W in the corresponding process n in a case where a pressure of the heat transfer gas supplied to the discharge port lib is reduced to be lower than the pressure $P_n$; and the temperature $TW'_{n,min}$ of the substrate W in the corresponding process n in a case where a pressure of the heat transfer gas supplied to the discharge port 11b is increased to be greater than the pressure $P_n$. Thus, the temperature controlling method according to the embodiment is capable of acquiring the temperature TB of the temperature-controlling medium, the temperature $TW_n$, the temperature $TW'_{n,max}$, and the temperature $TW'_{n,min}$ without actually measuring the temperature.

The temperature controlling method according to the embodiment further includes, for each of the processes n, determining whether or not a temperature change of the substrate W exceeds a predetermined threshold. The temperature controlling method according to the embodiment further includes, in a case where the temperature change of the substrate W exceeds the threshold in one of the processes, acquiring the temperature $TW'_{n,max}$ and the temperature $TW'_{n,min}$. Thus, the temperature controlling method according to the embodiment is capable of correcting a change in a temperature of the substrate W in each of the processes n in a case where a temperature change in the substrate W becomes a large to exceed the threshold in one of the processes.

So far, the embodiment has been explained; however, additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, in the above-mentioned embodiments, a case is exemplified in which the substrate W is a semiconductor wafer; however, not limited thereto. The substrate W may be anything.

Moreover, in the above-mentioned embodiments, a case is exemplified in which plasma etching is executed on the substrate W as one of a plurality of processes; however, not limited thereto. The plurality of processes may include any process as long as heat input occurs with respect to the substrate W in the process. For example, the plurality of processes may include a thermal treatment such as ashing.

Moreover, in the above-mentioned embodiments, a case is exemplified in which the substrate processing apparatus 1 is a plasma processing apparatus that executes a plasma process; however, not limited thereto. The substrate processing apparatus 1 may be any apparatus as long as the apparatus executes substrate processing in which heat input occurs with respect to the substrate W. For example, the substrate processing apparatus 1 may be a film forming apparatus or the like.

According to the present disclosure, it is possible to correct a change in the temperature of a substrate for each process in a case where a plurality of processes is executed on the substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A temperature controlling method comprising:
acquiring:
a temperature TB of a temperature-controlling medium before a temperature change during execution of a plurality of processes n (n is identifier of process and is natural number that is greater than one) in each of which heat is input to a substrate placed on a placement surface of a stage, wherein the placement surface on which the substrate is placed is formed on the stage, a flow path through which the temperature-controlling medium having an adjusted temperature flows is formed in the stage, and a discharge port via which heat transfer gas is discharged toward the placement surface is formed in the stage; and for each of the processes n, a pressure $P_n$ of heat transfer gas supplied to the discharge port and a temperature $TW_n$ of the substrate;
acquiring:
for each of the processes n after the temperature change while using a temperature of the temperature-controlling medium as the temperature TB, a temperature $TW'_{n,max}$ of the substrate in the corresponding process n in a case where a pressure of the heat transfer gas supplied to the discharge port is reduced to be lower than the pressure $P_n$; and
a temperature $TW'_{n,min}$ of the substrate in the corresponding process n in a case where a pressure of the heat transfer gas supplied to the discharge port is increased to be greater than the pressure $P_n$;
adjusting a temperature of the temperature-controlling medium to a temperature TB" that satisfies a following formula (1); and
for each of the processes n, adjusting a pressure of the heat transfer gas supplied to the discharge port such that a temperature of the substrate is the temperature $TW_n$.

$$TB+\max(TW_n-TW'_{n,max}) \leq TB'' \leq TB+\min(TW_n-TW'_{n,min}) \quad (1).$$

2. The temperature controlling method according to claim 1, wherein
the acquiring the temperature $TW'_{n,max}$ and the temperature $TW'_{n,min}$ includes:
acquiring:
within a range in which transcription of a surface shape of the placement surface to the substrate does not occur, for each of the processes n after the temperature change while using a temperature of the temperature-controlling medium as the temperature TB, the temperature $TW'_{n,max}$ of the substrate in the corresponding process n in a case where a pressure of the heat transfer gas supplied to the discharge port is reduced to be lower than the pressure $P_n$; and
within a range in which abnormality due to leakage of the heat transfer gas does not occur, the temperature $TW'_{n,min}$ of the substrate in the corresponding process n in a case where a pressure of the heat transfer gas supplied to the discharge port is increased to be greater than the pressure $P_n$.
3. The temperature controlling method according to claim 2, wherein
the acquiring the temperature $TW_n$ and the acquiring the temperature $TW'_{n,max}$ and the temperature $TW'_{n,min}$ includes:
causing a measurement unit that measures a temperature of the substrate to measure a temperature of the substrate; and
acquiring the measured temperature.
4. The temperature controlling method according to claim 3, further comprising:
for each of the processes n, determining whether or not a temperature change of the substrate exceeds a predetermined threshold; and
in a case where the temperature change of the substrate exceeds the threshold in one of the processes, acquiring the temperature $TW'_{n,max}$ and the temperature $TW'_{n,min}$.
5. The temperature controlling method according to claim 2, wherein
the acquiring the temperature TB of the temperature-controlling medium and the temperature $TW_n$ includes:

US 12,598,959 B2

19 acquiring a temperature of the temperature-controlling medium and a temperature of the substrate in each of the processes n from a recipe that is stored as a processing condition, and the acquiring the temperature $TW'_{n,max}$ and the temperature $TW'_{n,min}$ includes:

by using relationship data that indicates relation between a pressure of the heat transfer gas and a temperature of the substrate for each of the processes n, the temperature $TW'_{n,max}$ of the substrate in the corresponding process n in a case where a pressure of the heat transfer gas supplied to the discharge port is reduced to be lower than the pressure $P_n$; and the temperature $TW'_{n,min}$ of the substrate in the corresponding process n in a case where a pressure of the heat transfer gas supplied to the discharge port is increased to be greater than the pressure $P_n$.

6. The temperature controlling method according to claim 1, wherein the acquiring the temperature $TW_n$ and the acquiring the temperature $TW'_{n,max}$ and the temperature $TW'_{n,min}$ includes:

causing a measurement unit that measures a temperature of the substrate to measure a temperature of the substrate; and acquiring the measured temperature.

7. The temperature controlling method according to claim 1, wherein the acquiring the temperature TB of the temperature-controlling medium and the temperature $TW_n$ includes:

acquiring a temperature of the temperature-controlling medium and a temperature of the substrate in each of the processes n from a recipe that is stored as a processing condition, and the acquiring the temperature $TW'_{n,max}$ and the temperature $TW'_{n,min}$ includes:

by using relationship data that indicates relation between a pressure of the heat transfer gas and a temperature of the substrate for each of the processes n, the temperature $TW'_{n,max}$ of the substrate in the corresponding process n in a case where a pressure of the heat transfer gas supplied to the discharge port is reduced to be lower than the pressure $P_n$; and the temperature $TW'_{n,min}$ of the substrate in the corresponding process n in a case where a pressure of the heat transfer gas supplied to the discharge port is increased to be greater than the pressure $P_n$.

8. The temperature controlling method according to claim 1, further comprising:

for each of the processes n, determining whether or not a temperature change of the substrate exceeds a predetermined threshold; and

in a case where the temperature change of the substrate exceeds the threshold in one of the processes, acquiring the temperature $TW'_{n,max}$ and the temperature $TW'_{n,min}$.

9. A substrate processing apparatus comprising:

a stage in which a placement surface is formed, wherein a substrate is placed on the placement surface; in which a flow path is formed, wherein a temperature-controlling medium flows through the flow path; and in which a discharge port is formed, wherein heat transfer gas is discharged toward the placement surface via the discharge port;

a temperature-controlling medium supply unit that adjusts a temperature of the temperature-controlling medium, and supplies the temperature-controlling medium whose temperature is adjusted;

a gas supplying unit that supplies the heat transfer gas that is discharged from the discharge port;

a first acquisition unit that acquires:

a temperature TB of the temperature-controlling medium before a temperature change during execution of a plurality of processes n (n is identifier of process and is natural number that is greater than one) in each of which heat is input to the substrate; and for each of the processes n, a pressure $P_n$ of the heat transfer gas supplied from the gas supplying unit and a temperature $TW_n$ of the substrate;

a second acquisition unit that acquires:

for each of the processes n after the temperature change while using a temperature of the temperature-controlling medium as the temperature TB, a temperature $TW'_{n,max}$ of the substrate in the corresponding process n in a case where a pressure of the heat transfer gas supplied from the gas supplying unit is reduced to be lower than the pressure $P_n$; and a temperature $TW'_{n,min}$ of the substrate in the corresponding process n in a case where a pressure of the heat transfer gas supplied from the gas supplying unit is increased to be greater than the pressure $P_n$; and an adjustment unit that adjusts a temperature of the temperature-controlling medium to a temperature $TB''$ that satisfies a following formula (2); and adjusts, for each of the processes n, a pressure of the heat transfer gas supplied from the gas supplying unit such that a temperature of the substrate is the temperature $TW_n$.

$$TB + \max(TW_n - TW'_{n,max}) \le TB'' \le TB + \min(TW_n - TW'_{n,min}) \quad (2)$$

* * * * *